(12) United States Patent
Okuda et al.

(10) Patent No.: US 6,535,452 B2
(45) Date of Patent: Mar. 18, 2003

(54) SEMICONDUCTOR MEMORY DEVICE HAVING ERROR CORRECTION FUNCTION FOR DATA READING DURING REFRESH OPERATION

(75) Inventors: Masaki Okuda, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/097,621

(22) Filed: Mar. 15, 2002

(65) Prior Publication Data

US 2003/0007410 A1 Jan. 9, 2003

(30) Foreign Application Priority Data

Jul. 9, 2001 (JP) ........................................ 2001-208069

(51) Int. Cl.$^7$ ................................................. G11C 8/00
(52) U.S. Cl. .................. 365/230.03; 365/200; 365/201; 714/766; 714/800; 714/801; 714/767
(58) Field of Search ............................ 365/230.03, 200, 365/201; 714/766, 800, 801, 767

(56) References Cited

U.S. PATENT DOCUMENTS

| 5,033,050 A | * | 7/1991 | Murai ......................... 714/800 |
| 5,313,425 A | * | 5/1994 | Lee et al. .................... 365/201 |
| 6,421,292 B1 | * | 7/2002 | Kitamoto et al. ...... 365/189.04 |

\* cited by examiner

*Primary Examiner*—Richard Elms
*Assistant Examiner*—Toan Le
(74) *Attorney, Agent, or Firm*—Arent Fox Kintner Plotkin & Kahn, PLLC

(57) ABSTRACT

A semiconductor memory device includes a plurality of memory blocks, each of which is refreshed independently of one another, m (m>1) data pins, each of which continuously receives or outputs n (n>1) data pieces, a conversion circuit which converts data of each of the data pins between parallel data and serial data, m×n data bus lines on which the n data pieces are expanded in parallel with respect to each of the m data pins, m address selection lines which are connected to m respective blocks of the memory blocks corresponding to the m respective data pins, and are simultaneously activated, the activation of any one of the address selection lines connecting the data bus lines to a corresponding one of the m respective blocks and resulting in the n data pieces being input/output to/from the corresponding one of the m respective blocks.

8 Claims, 12 Drawing Sheets

SEMICONDUCTOR MEMORY DEVICE HAVING ERROR CORRECTION FUNCTION FOR DATA READING DURING REFRESH OPERATION

BACKGROUND OF THE INVENTION

1. Field of the Invention

The present invention generally relates to semiconductor memory devices, and particularly relates to a semiconductor memory device which automatically carries out a refresh operation inside the device without requiring an external refresh command, and reads data during the refresh operation while attending to error correction.

2. Description of the Related Art

In DRAMs (dynamic random access memories), data are read from memory cells corresponding to a selected word line, and are amplified by sense amplifiers, followed by supplying data from the sense amplifier of a selected column to the exterior of the device. A DRAM is typically provided with a plurality of data input/output pins DQ, which outputs a plurality of data bits simultaneously. In order to reduce electric power consumption associated with access operations and to reduce the chip size by reduction of the number of wire lines, the plurality of DQ pins are associated with a single column line rather than associating a single DQ pin with a single column line. Namely, a plurality of sense amplifiers are connected to a single column line, and data of these sense amplifiers are input/output in parallel from/to the plurality of DQ pins.

For the purpose of speeding up the operation speed of semiconductor memory devices, generally, the operation of core circuits inside the memory devices need to be made faster. It is difficult, however, to speed up the operation of core circuits because of limitations such as wire delays. When a fixed number of data bits are to be serially input/output upon a single access, provision may be made not only to read data corresponding to the plurality of DQ pins in parallel from the memory core, but also to read serially output data in parallel from the memory core, then subjecting the data to parallel-&-serial conversion to arrange them sequentially along a time axis. With this provision, the data transfer rate to the exterior of the device can be improved without changing the operation speed of a core circuit. In detail, each column line is associated with a plurality of DQ pins, and a plurality of column lines are simultaneously activated that are equal in number to the number of data bits to be arranged along the time axis upon a single access, thereby reading the sequential data through parallel access.

FIGS. 1A and 1B are drawings showing data read operations in a case in which a column line is activated when each column line is associated with a plurality of DQ pins and in a case in which a plurality of column lines are activated when each column line is associated with a plurality of DQ pins.

In FIG. 1A, each column line is assigned to DQ0 and DQ1, and a single column line is selectively activated to output data to the DQ0 pad and the DQ1 pad simultaneously. At a first cycle, a column line C1 is activated to output first data along the time axis. At a second cycle, a column line C2 is activated to output second data along the time axis.

In FIG. 1B, each column line is assigned to DQ0 and DQ1, and a plurality of column lines are simultaneously activated to concurrently output respective data to the DQ0 pad and the DQ1 pad and sequentially output a plurality of data along the time axis. At the first and second cycles, the column lines C1 and C2 are activated to output data of the column line C1 at the first cycle and to output data of the column line C2 at the second cycle.

In DRAMs, there is a need to periodically refresh data that are stored in memory cells. During the period in which a refresh operation is carried out for a given memory block, read/write access to this memory block is generally not possible. There are schemes, however, that make it possible to perform a data access operation concurrently with a refresh operation, thereby improving the efficiency of semiconductor memory devices.

One of such schemes uses parity bits, and this scheme is taught by an invention (Japanese Patent Application No. 2000-368423) assigned to the assignee of the present application. A parity bit is calculated with respect to a plurality of DQ data bits, and these DQ data bits are stored in memory together with the parity bit. Here, the plurality of DQ data bits are stored in respective memory blocks, and the parity bit is stored in a parity-bit-storage-purpose memory block. At the time of data read operation, the plurality of DQ data bits are read from the respective memory blocks, and the parity bit is read from the parity-bit-storage-purpose memory block. A parity check is carried out based on the retrieved DQ data bits and the parity bit. If a parity error is detected during a refresh operation, a data bit retrieved from the memory block that is currently being refreshed is corrected, and, then, the DQ data bits are output.

No attempt has ever been made to apply this error correction function for a refresh operation based on the use of parity bit to the configuration of FIG. 1B.

Accordingly, there is a need for a semiconductor memory device that has an error correction function for a refresh operation in a configuration in which each address line is associated with a plurality of data bits, and a plurality of address lines are simultaneously activated.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor memory device according to the present invention includes a plurality of memory blocks, each of which is refreshed independently of one another, m (m>1) data pins, each of which continuously receives or outputs n (n>1) data pieces, a conversion circuit which converts data of each of the data pins between parallel data and serial data, m×n data bus lines on which the n data pieces are expanded in parallel with respect to each of the m data pins, m address selection lines which are connected to m respective blocks of the memory blocks corresponding to the m respective data pins, and are simultaneously activated, the activation of any one of the address selection lines connecting the data bus lines to a corresponding one of the m respective blocks and resulting in the n data pieces being input/output to/from the corresponding one of the m respective blocks, and a parity data comparison circuit which performs a parity check on m data pieces read from the m respective blocks corresponding to the m respective data pins and a parity bit read from a parity-purpose memory block, the parity check being performed separately with respect to each of the n data pieces.

The semiconductor memory device described above has a configuration in which each address selection line is responsible for a plurality of data pieces, and a plurality of address selection lines are simultaneously activated. In this configuration, the present invention performs a parity check on m data pieces read from the m respective blocks and a parity bit read from a parity-purpose memory block separately with respect to each of the n data pieces, thereby providing an error correction function for a refresh operation.

According to one aspect of the present invention, the semiconductor memory device described above further includes a mask circuit which masks a specific one of the n data pieces with respect to all the m data pins at a time of data writing. In this configuration in which each address selection line is responsible for the n data pieces, and the m address selection lines correspond to the m respective data pins, the parity check that is directed to the m data pieces can be performed properly even if one of the n data pieces is nonexistent.

According to the present invention, further, a semiconductor memory device includes a plurality of memory blocks, each of which is refreshed independently of one another, m (m>1) data pins, each of which continuously receives or outputs n (n>1) data pieces, a conversion circuit which converts data of each of the data pins between parallel data and serial data, m×n data bus lines on which the n data pieces are expanded in parallel with respect to each of the m data pins, n address selection lines which are connected to n respective blocks of the memory blocks corresponding to the n respective data pieces, and are simultaneously activated, the activation of any one of the address selection lines connecting the data bus lines to a corresponding one of the n respective blocks and resulting in m data pieces corresponding to the m respective data pins being input/output to/from the corresponding one of the n respective blocks, a parity data comparison circuit which performs a parity check on the n data pieces read from the n respective blocks and a parity bit read from a parity-purpose memory block, the parity check being performed separately with respect to each of the m data pieces, and a mask circuit which masks a specific one of the m data pieces with respect to all the n data pieces at a time of data writing.

In this configuration in which each address selection line is responsible for the m data pieces, and the n address selection lines correspond to the n respective data pieces, the parity check that is directed to the n data pieces can be performed properly even if one of the m data pieces is nonexistent.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
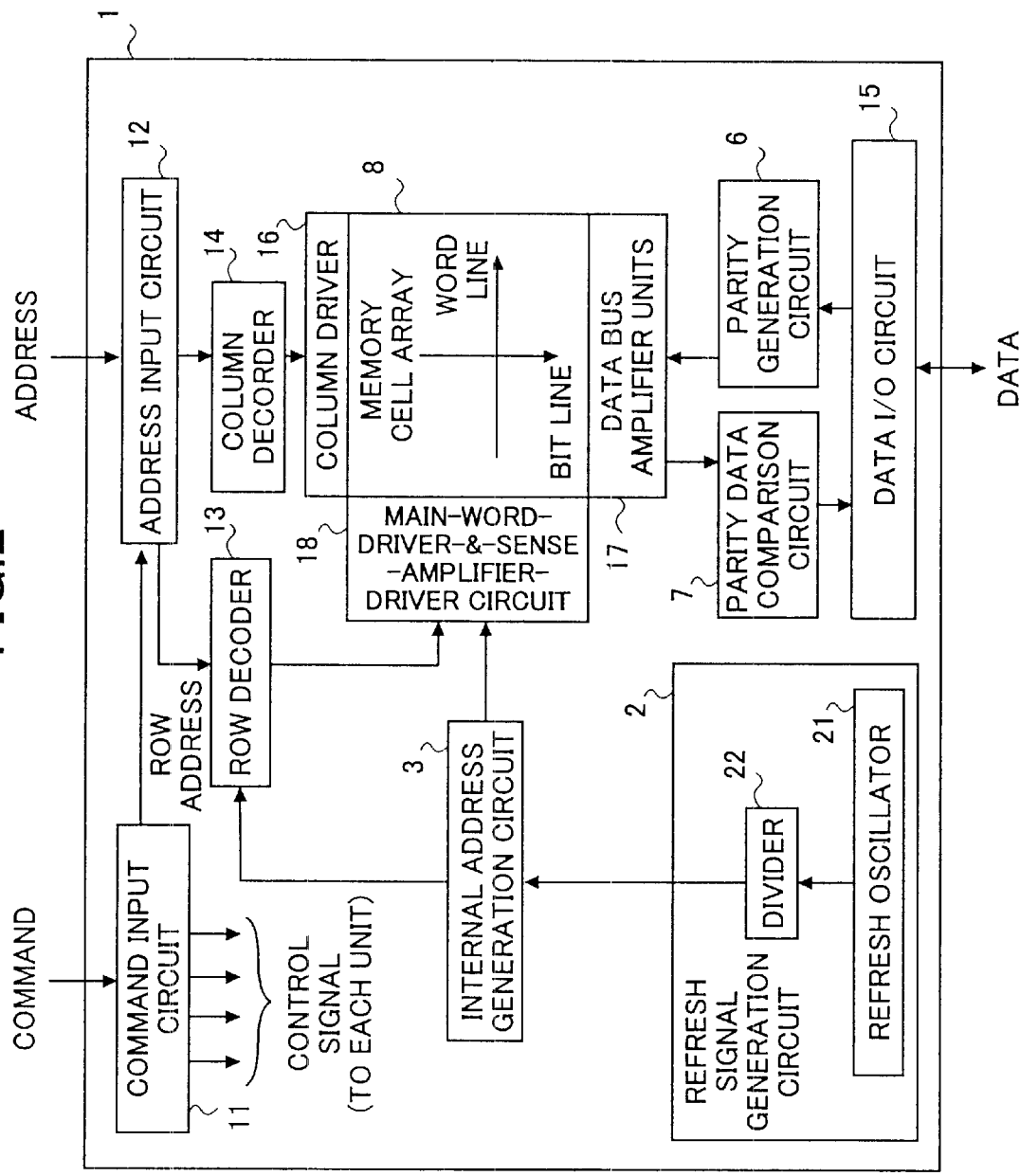
FIG. 2 is a block diagram showing an example of a configuration of a semiconductor memory device according to the present invention.

FIG. 2 is a block diagram showing an example of a configuration of a semiconductor memory device according to the present invention.

The semiconductor memory device of FIG. 2 includes a command input circuit 11, an address input circuit 12, a row decoder 13, a column decoder 14, a data I/O circuit 15, a refresh signal generation circuit 2, an internal address generation circuit 3, a parity generation circuit 6, a parity data comparison circuit 7, a memory cell array 8, a column driver 16, a data bus amplifier units 17 including a write amplifier and a read amplifier, and a main-word-driver-&-sense-amplifier-driver circuit 18.

The refresh signal generation circuit 2 includes a refresh oscillator 21 and a divider 22. The command input circuit 11 supplies a control signal to the address input circuit 12 for the purpose of capturing addresses according to a data read command and a data write command received from an external CPU or the like. The row decoder 13 and the column decoder 14 decode the captured addresses, and supply the decoded addresses to the main-word-driver-&-sense-amplifier-driver circuit 18 and the column driver 16. Operation of each circuit/unit is controlled based on the command that is received by the command input circuit 11 from the exterior of the device. That is, the command input circuit 11 decodes a command to generate control signals, which are then supplied to respective circuit/units to control the operation of each circuit/unit.

In the semiconductor memory device according to the present invention, the refresh signal generation circuit 2 generates a refresh signal inside the semiconductor memory device, and a refresh operation is performed with respect to an address that is generated by the internal address generation circuit 3 in response to the refresh signal.

At the time of data writing, the parity generation circuit 6 generates a parity bit, which is then stored in the memory cell array 8. Even when a refresh operation overlaps a routine data read operation or data write operation, the refresh operation will be performed. Since data read from the block that is currently being refreshed is not valid, this data is compared with the parity bit to perform a parity check. In the case of parity error, an error is corrected by reversing the data read from the block that is being refreshed. The comparison with the parity bit and the error correction are performed by the parity data comparison circuit 7.

Figure 3:
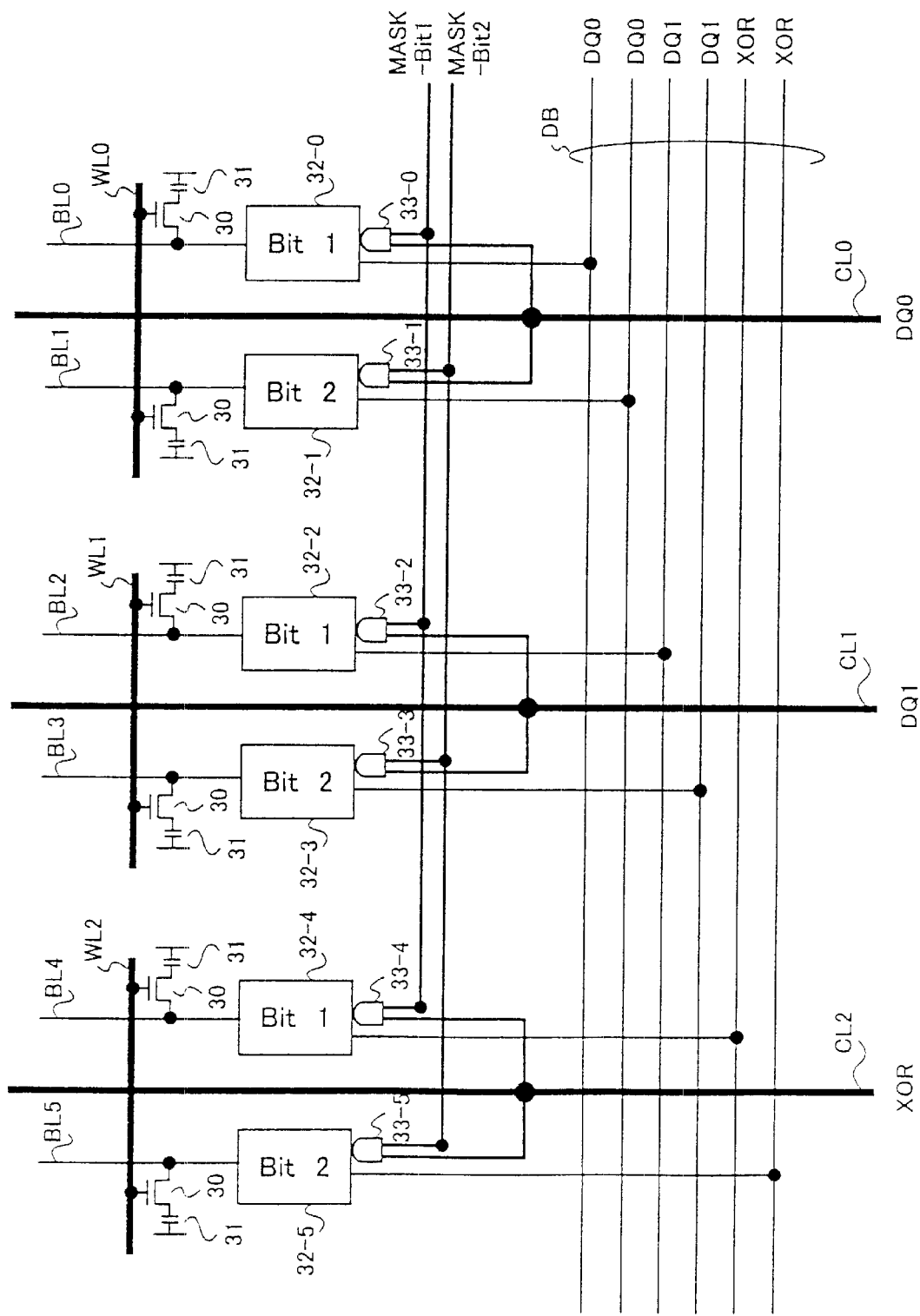
FIG. 3 is a circuit diagram showing an example of a memory cell array of FIG. 2.

FIG. 3 is a circuit diagram showing an example of the memory cell array 8 according to the present invention.

The circuit of FIG. 3 corresponds to a portion of the memory cell array 8 in a case where two DQ pins DQ0 and DQ1 are provided. The circuit of FIG. 3 includes a plurality of cell gate transistors 30, a plurality of memory cells 31, a plurality of sense amplifiers 32-0 through 32-5, a plurality of AND circuits 33-0 through 33-5, a plurality of word lines WL0 through WL2, a plurality of bit lines BL0 through BL5, and a plurality of column lines CL0 through CL2, and a data bus DB. The sense amplifiers 32-0 and 32-1 connected to the respective bit lines BL0 and BL1 correspond to the data pin DQ0. These sense amplifiers 32-0 and 32-1 are selected in response to the activation of the column line CL0 corresponding to the data pin DQ0 so as to be connected to the data bus DB. The data of the sense amplifiers 32-0 and 32-1 correspond to the first data Bit1 and the second data Bit2, respectively, of the data pin DQ0 along the time axis.

By the same token, the sense amplifiers 32-2 and 32-3 connected to the respective bit lines BL2 and BL3 correspond to the data pin DQ1. These sense amplifiers 32-2 and 32-3 are selected in response to the activation of the column line CL1 corresponding to the data pin DQ1 so as to be connected to the data bus DB. The data of the sense amplifiers 32-2 and 32-3 correspond to the first data Bit1 and the second data Bit2, respectively, of the data pin DQ1 along the time axis.

Furthermore, the sense amplifiers 32-4 and 32-5 connected to the respective bit lines BL4 and BL5 correspond to the respective parity bits for the data pins DQ0 and DQ1. These sense amplifiers 32-4 and 32-5 are selected in response to the activation of the column line CL2 corresponding to the parity bit so as to be connected to the data bus DB. The data of the sense amplifiers 32-4 and 32-5 correspond to the parity bit for the first data Bit1 and the parity bit for the second data Bit2, respectively, along the time axis. Here, the parity bit is calculated through an XOR operation, so that it is designated as "XOR" in FIG. 3.

The word lines WL0 through WL2 are provided separately for the data pin DQ0, the data pin DQ1, and the parity bit, respectively. It is thus possible to perform a refresh operation independently with respect to each of the data pin DQ0, the data pin DQ1, and the parity bit. If data needs to be read while a refresh operation is being performed with respect to the data pin DQ0, the data of the data pin DQ0, the data of the data pin DQ1, and a parity bit are read, and a parity check is performed, followed by correcting the data of the data pin DQ0 as necessary. The parity check and the error correction are carried out with respect to the first data Bit1 and the second data Bit2 separately along the time axis.

The AND circuits 33-0 through 33-5 are each provided for the purpose of performing an AND operation between a column line signal and a mask signal to select a sense amplifier. The mask signal (MASK-Bit1 and MASK-Bit2) serves to prevent data from being written in the memory cells when data is masked at the time of data writing.

Figure 4:
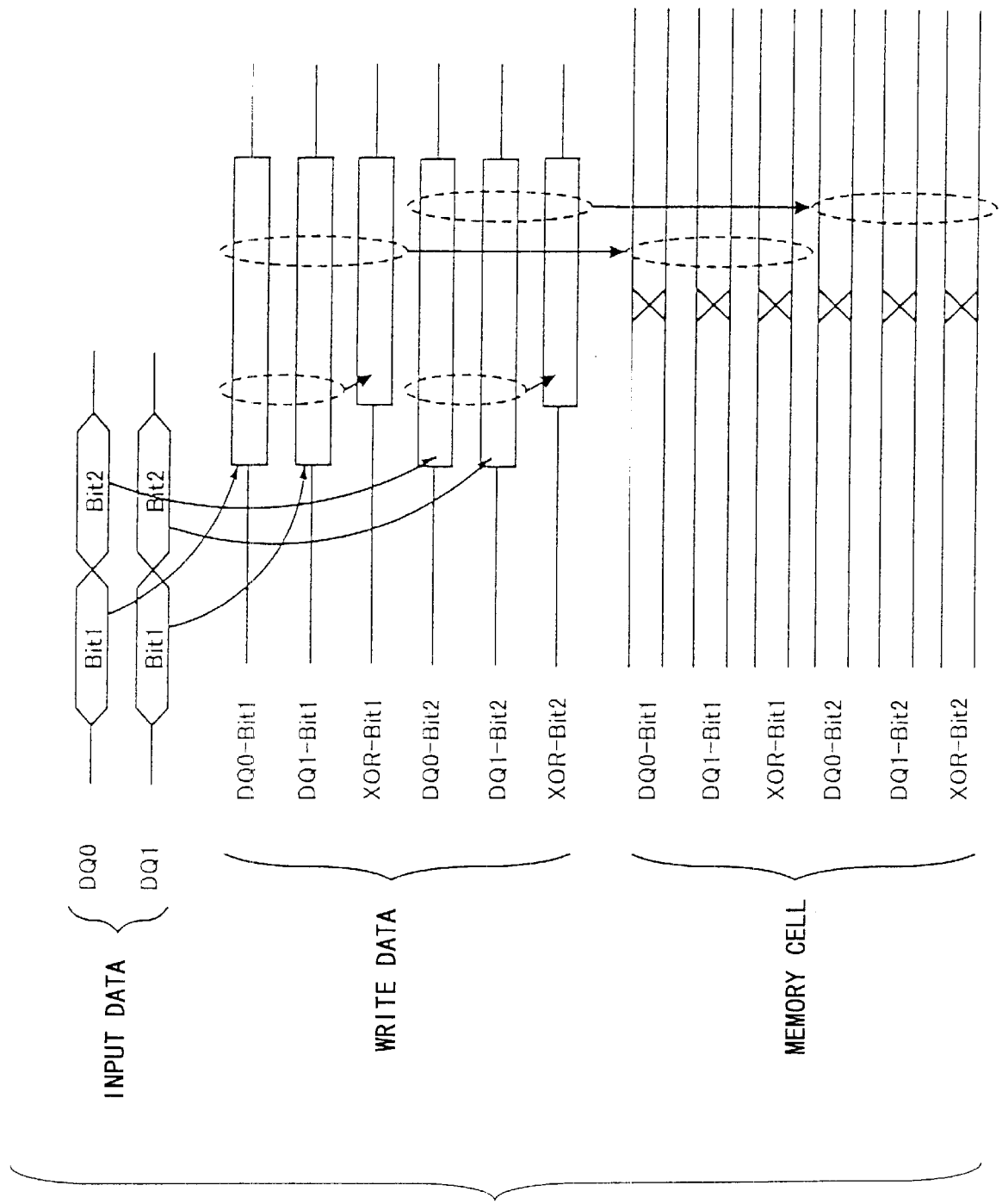
FIG. 4 is a timing chart showing the operation of data writing with respect to the configuration of FIG. 3.

FIG. 4 is a timing chart showing the operation of data writing with respect to the configuration of FIG. 3.

As shown in FIG. 4, the first data Bit1 and the second data Bit2 are supplied to the data pin DQ0, and, also, the first data Bit1 and the second data Bit2 are supplied to the data pin DQ1. These data are subjected to serial-to-parallel conversion, and are stored in the sense amplifiers 32-0 through 32-5 as parallel data, as shown as "WRITE DATA" in FIG. 4. The data of the sense amplifiers 32-0 through 32-5 are simultaneously stored in the memory cells 31 through the bit lines BL0 through BL5, as shown as "MEMORY CELL" in FIG. 4.

Figure 5:
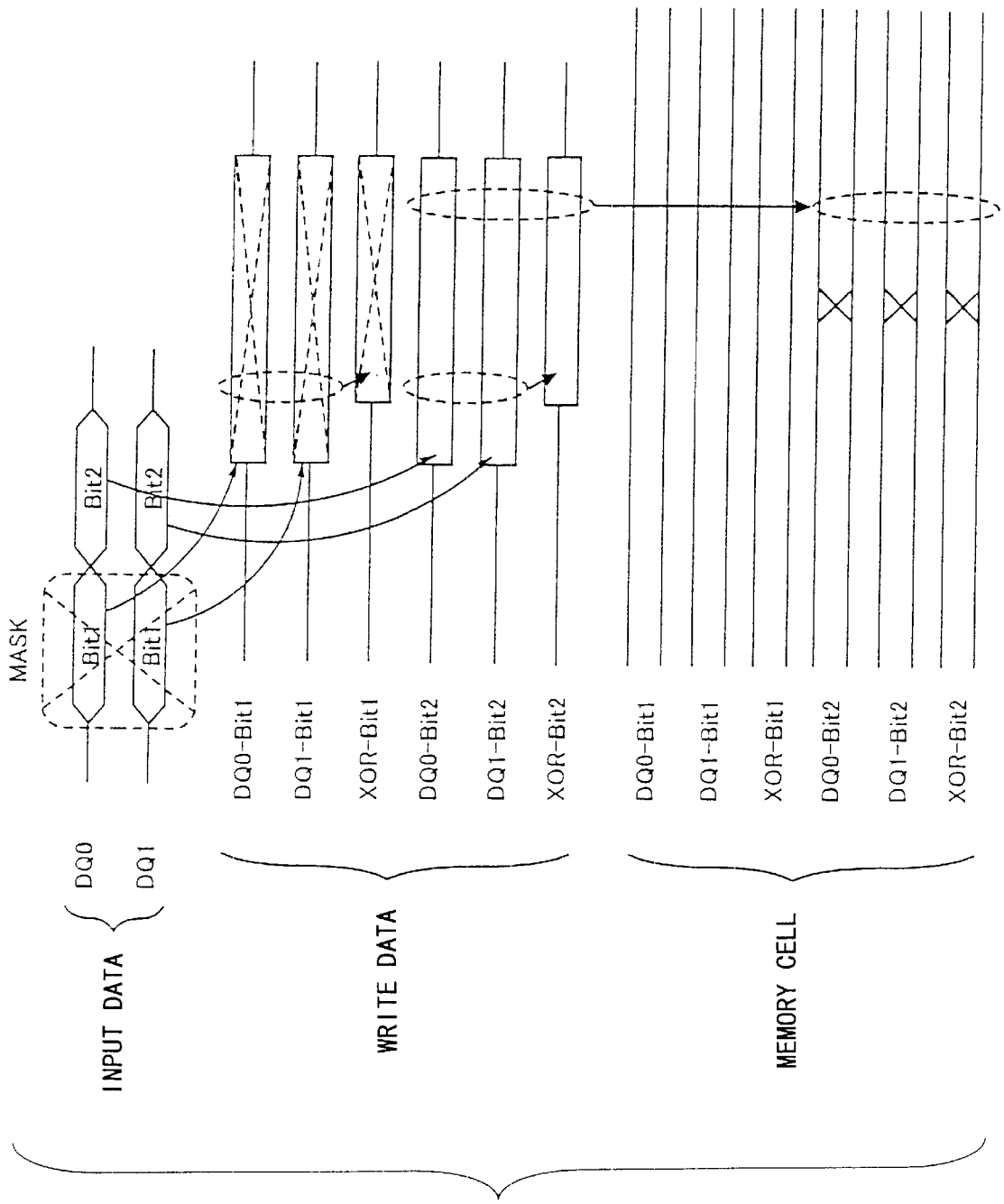
FIG. 5 is a timing chart showing an operation of masking a first data in relation to the operation of FIG. 4.

FIG. 5 is a timing chart showing an operation of masking the first data in relation to the operation of FIG. 4.

As shown in FIG. 5, when the first data Bit1 is masked at the time of data writing, the masked data Bit1 is not stored in the sense amplifiers, and only the data Bit2 that was not masked is stored in the sense amplifiers, as shown as "WRITE DATA". Then, the data of the sense amplifiers are simultaneously stored in the memory cells 31 through the bit lines BL0 through BL5, as shown as "MEMORY CELL" in FIG. 5.

With reference to FIG. 3 again, as previously described, the AND circuits 33-0 through 33-5 are provided for the purpose of performing an AND operation between a column line signal and a mask signal so as to select a sense amplifier. Turning the mask signal MASK-Bit1 to LOW results in the outputs of the AND circuits 33-0, 33-2, and 33-4 being LOW, so that the sense amplifiers 32-0, 32-2, and 32-4 are not connected to the data bus DB even when the respective column lines are selected. As a consequence, the first data Bit1 and the parity bit corresponding thereto supplied to the data bus DB are not supplied to the respective sense amplifiers 32-0, 32-2, and 32-4. In this manner, turning the mask signal MASK-Bit1 to LOW will mask the first data Bit1. By the same token, turning the mask signal MASK-Bit2 to LOW will mask the second data Bit2.

Figure 1A:
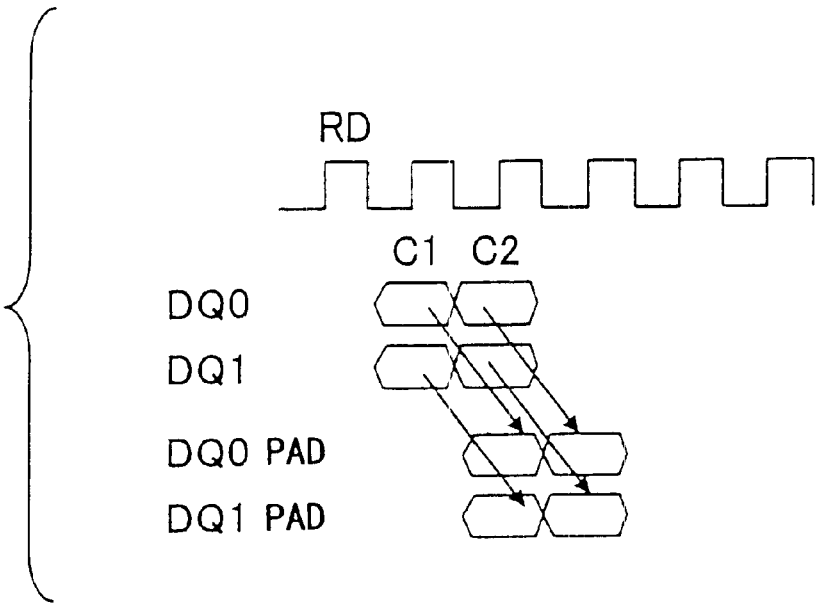
FIGS. 1A and 1B are drawings showing data read operations in a case in which a column line is activated when each column line is associated with a plurality of DQ pins and in a case in which a plurality of column lines are activated when each column line is associated with a plurality of DQ pins.
Figure 1B:
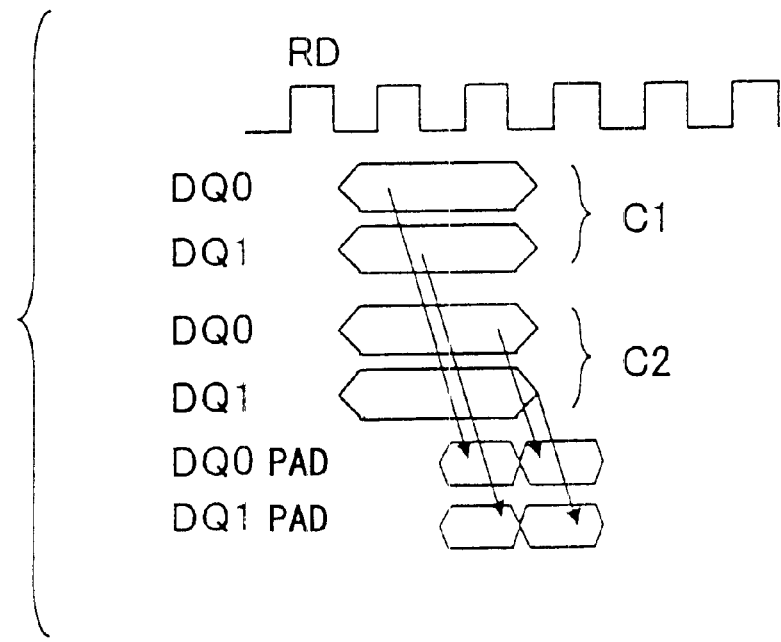

In the configuration of FIG. 3, sense amplifiers connected to the same column line correspond to the data Bit1 and the data Bit2, respectively, which are arranged along the time axis, and each column line corresponds to a different data pin DQ. This configuration is thus different from the configuration of FIG. 1B in which each column line is responsible for a plurality of DQ pins, and corresponds to a different one of data pieces arranged along the time axis. This is because the configuration of FIG. 3 is necessary to achieve a bit-specific mask operation, i.e., to achieve a mask operation that masks a specified one of the data Bit1 and Bit2 arranged along the time axis. If sense amplifiers connected to a column line are associated with data pins DQ0 and DQ1, and each column line corresponds to a different bit, data correction for a refresh operation cannot be attained when a bit-specific mask operation is carried out.

For the sake of argument, consideration is given to a case in which the column lines CL0, CL1, and CL2 are provided to correspond to the first bit Bit1, the second bit Bit2, and the parity bit, respectively. In such a case, if the first bit Bit1 is masked on a bit-specific basis, the first bit Bit1 corresponding to the column line CL0 will not exist for all the DQ pins. Since a parity check is performed between the data of the column lines CL0, CL1, and CL2, a bit-specific masking operation will result in one of the bits for a parity check being nonexistent. In such a configuration, therefore, a parity check cannot be made (i.e., a parity bit cannot be generated).

Because of the reason described above, the present invention makes each column line responsible for a plurality of data bits arranged along the time axis, and makes the plurality of column lines correspond to respective data pins DQ when a bit-specific mask operation is performed. Accordingly, even when the first bits Bit1 are masked on a bit-specific basis, a parity check can be made with respect to the second bits Bit2.

As can be understood from the above description, if a mask operation is performed on a data-pin-specific basis rather than on a bit-specific basis, a plurality of column lines need to correspond to respective data bits arranged along the time axis, rather than correspond to respective data pins DQ as shown in FIG. 3.

Figure 6:
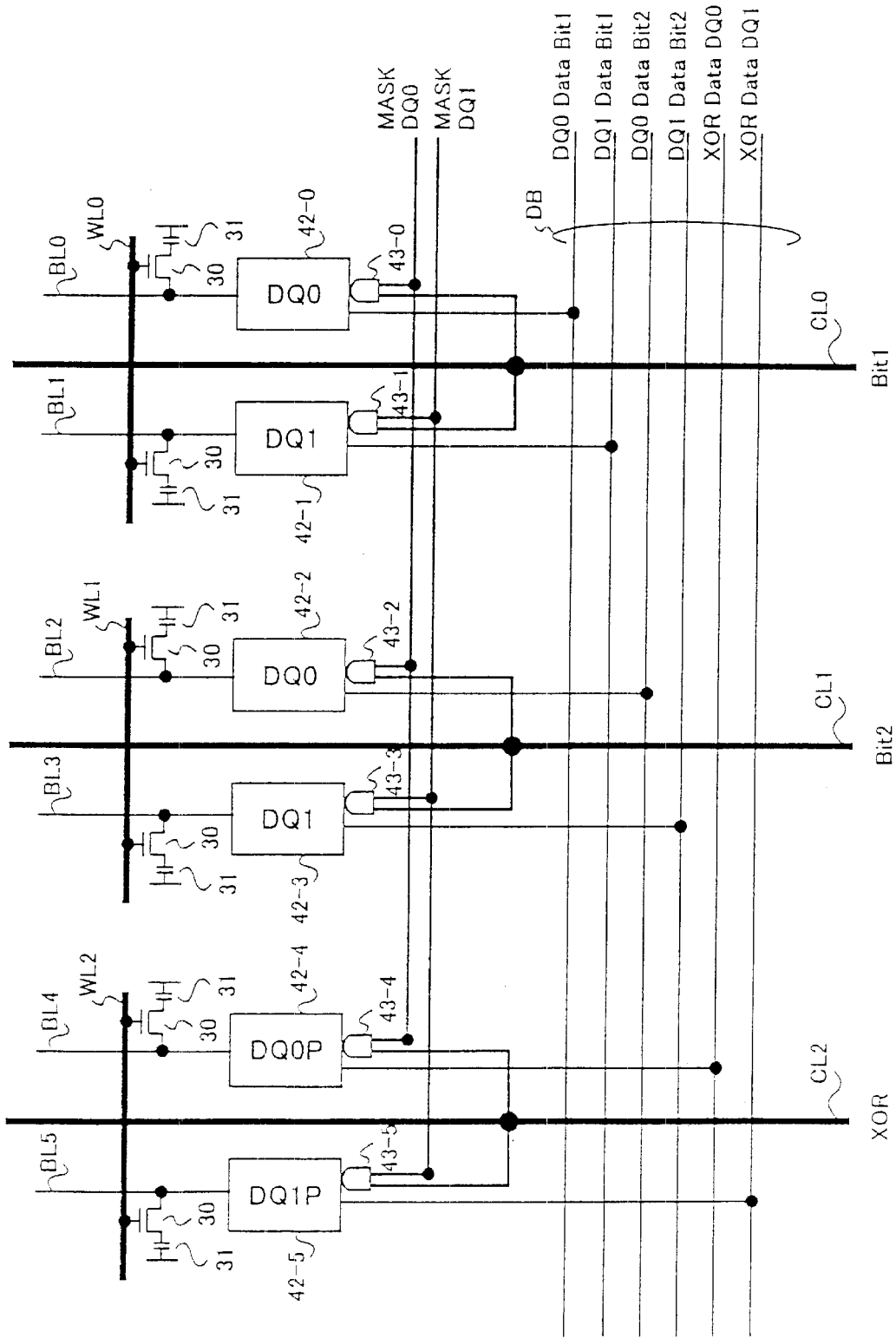
FIG. 6 is a circuit diagram showing an example of a configuration of the memory cell array in the case of a data-pin-specific mask operation.

FIG. 6 is a circuit diagram showing an example of a configuration of the memory cell array 8 according to the present invention in the case of a data-pin-specific mask operation.

The circuit of FIG. 6 includes the plurality of cell gate transistors 30, the plurality of memory cells 31, a plurality of sense amplifiers 42-0 through 42-5, a plurality of AND circuits 43-0 through 43-5, a plurality of word lines WL0 through WL2, a plurality of bit lines BL0 or BL5, a plurality of column lines CL0 through CL2, and a data bus DB.

The sense amplifiers 42-0 and 42-1 both correspond to the first data bit Bit1, and are selected in response to the activation of the column line CL0 so as to be connected to the data bus DB. The data of the sense amplifiers 42-0 and 42-1 correspond to the data pin DQ0 and the data pin DQ1, respectively. By the same token, the sense amplifiers 42-2 and 42-3 both correspond to the second data bit Bit2, and are selected in response to the activation of the column line CL1 so as to be connected to the data bus DB. The data of the sense amplifiers 42-2 and 42-3 correspond to the data pin DQ0 and the data pin DQ1, respectively. Furthermore, the sense amplifiers 42-4 and 42-5 correspond to the parity bit for the data of the data pin DQ0 and the parity bit of the data of the data pin DQ1, respectively.

The word lines WL0 through WL2 are provided separately for the data bit Bit1, the data bit Bit2, and the parity bit, respectively. It is thus possible to perform a refresh operation independently with respect to each of the data bit Bit1, the data bit Bit2, and the parity bit. If data needs to be read while a refresh operation is being performed with respect to the data bit Bit1, the data of the data bit Bit1, the data bit Bit2, and the parity bit are read, and a parity check is performed, followed by correcting the data of the data bit Bit1 as necessary. The parity check and the error correction are carried out with respect to the data pin DQ0 and the data pin DQ1 separately.

The AND circuits 43-0 through 43-5 are each provided for the purpose of performing an AND operation between a column line signal and a mask signal to select a sense amplifier. The circuit of FIG. 6 is configured in such a manner as to mask data on a data-pin-specific basis. Because of this, each column line does not correspond to a different data pin, but corresponds to a different one of data bits arranged along the time axis. Accordingly, a parity check for the data pin DQ1 can be made even when the data of the data pin DQ0 is masked on a data-pin-specific basis.

In this manner, the present invention changes the circuit configuration of the memory cell array as shown in FIG. 3 or FIG. 6 between the case of a bit-specific masking operation and the case of a data-pin-specific masking operation, thereby making it possible to make a parity check properly during a refresh operation.

Figure 7A:
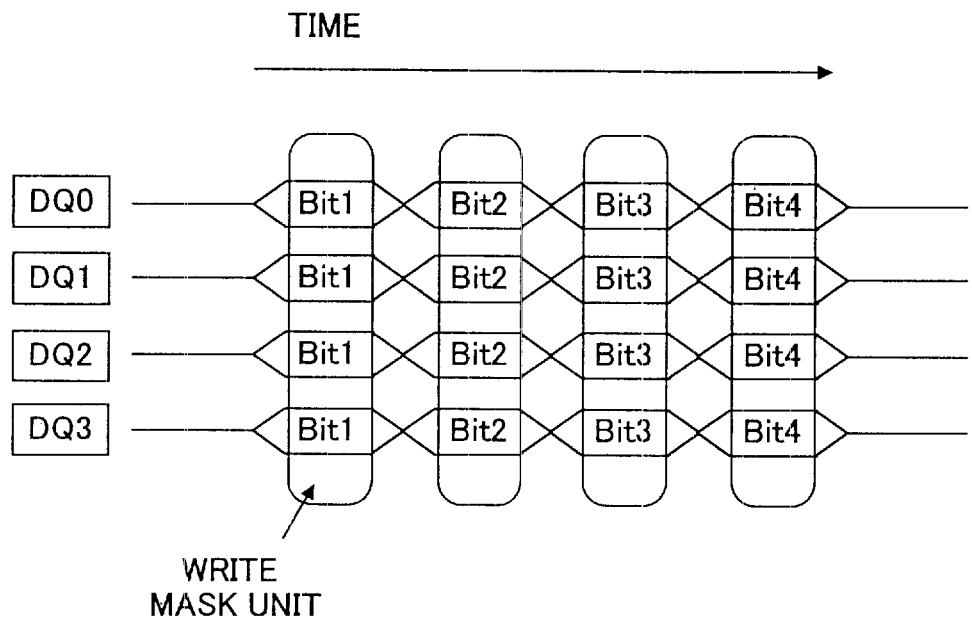
FIGS. 7A and 7B are illustrative drawings showing a bit-specific mask operation and a corresponding circuit configuration of the memory cell array.
Figure 7B:
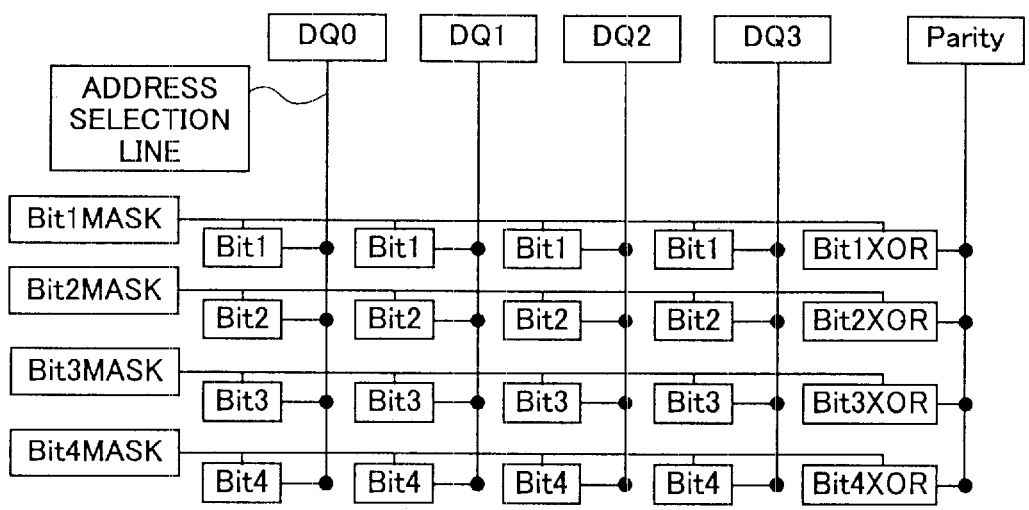

FIGS. 7A and 7B are illustrative drawings showing a bit-specific mask operation and a corresponding circuit configuration of the memory cell array. In this example, 4 data pins DQ are provided, and 4 data bits are arranged along the time axis. As shown in FIG. 7A, a masking operation is performed on a bit-specific basis. In the case of this mask operation, the memory cell array needs to be implemented to have the circuit arrangement of FIG. 7B. Namely, the plurality of address selection lines (e.g., column lines) are provided to correspond to respective data pins, and each address selection line is connected in parallel to the plurality of data bits arranged along the time axis. Further, a parity check is performed between the plurality of data pins. With this provision, a parity check can be made with respect to each of the data bits Bit2 through Bit4 even if the data bit Bit1 is masked on a bit-specific basis and thus nonexistent.

Figure 8A:
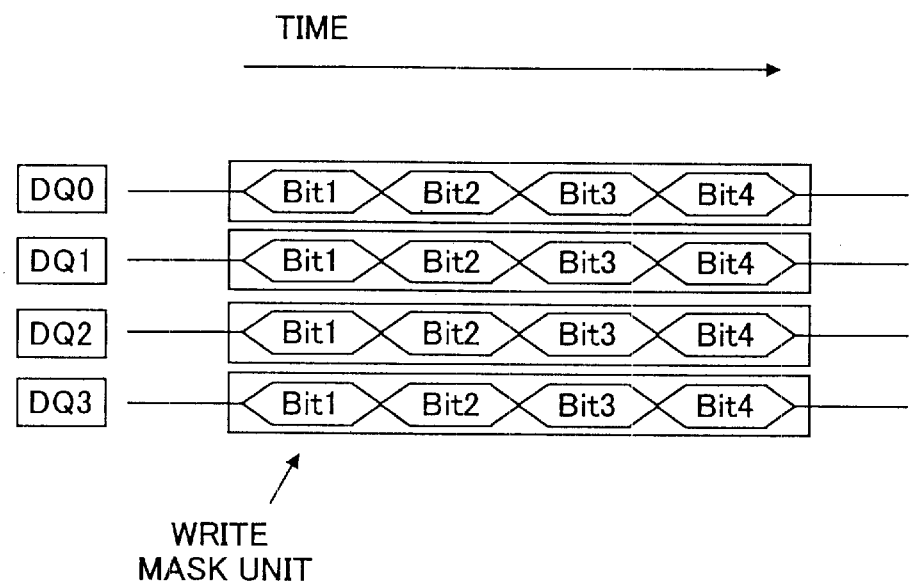
FIGS. 8A and 8B are illustrative drawings showing a data-pin-specific mask operation and a corresponding circuit configuration of the memory cell array.
Figure 8B:
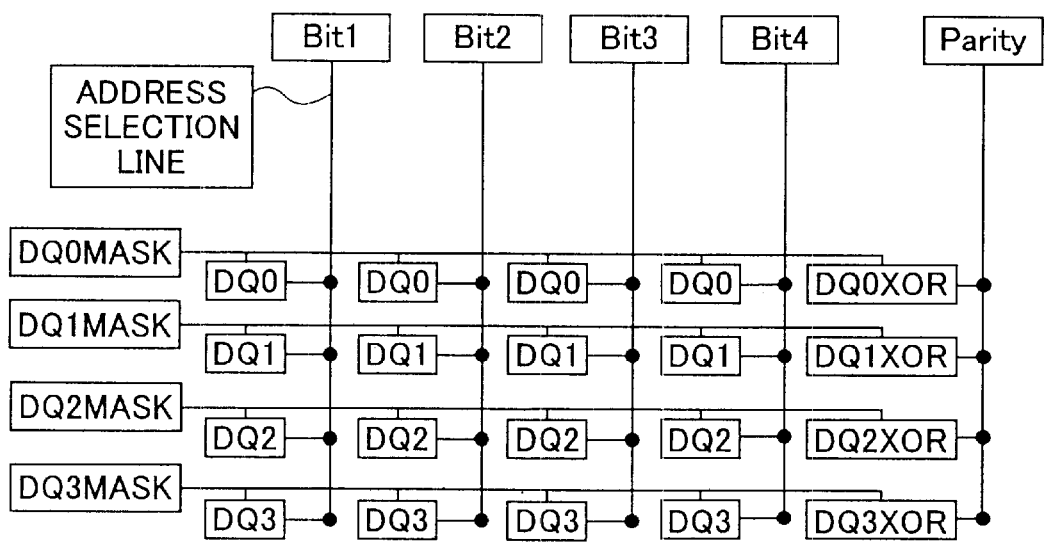

FIGS. 8A and 8B are illustrative drawings showing a data-pin-specific mask operation and a corresponding circuit configuration of the memory cell array. In this example, 4 data pins DQ are provided, and 4 data bits are arranged along the time axis. As shown in FIG. 8A, a masking operation is performed on a data-pin-specific basis. In the case of this mask operation, the memory cell array needs to be implemented to have the circuit arrangement of FIG. 8B. Namely, the plurality of address selection lines (e.g., column lines) are provided to correspond to respective data bits arranged along the time axis, and each address selection line is connected in parallel to the plurality of data pins. Further, a parity check is performed between the plurality of data bits arranged along the time axis. With this provision, a parity check can be made with respect to each of the data pins DQ1 through DQ3 even if the data pin DQ0 is masked on a.data-pin-specific basis and thus nonexistent.

Figure 9:
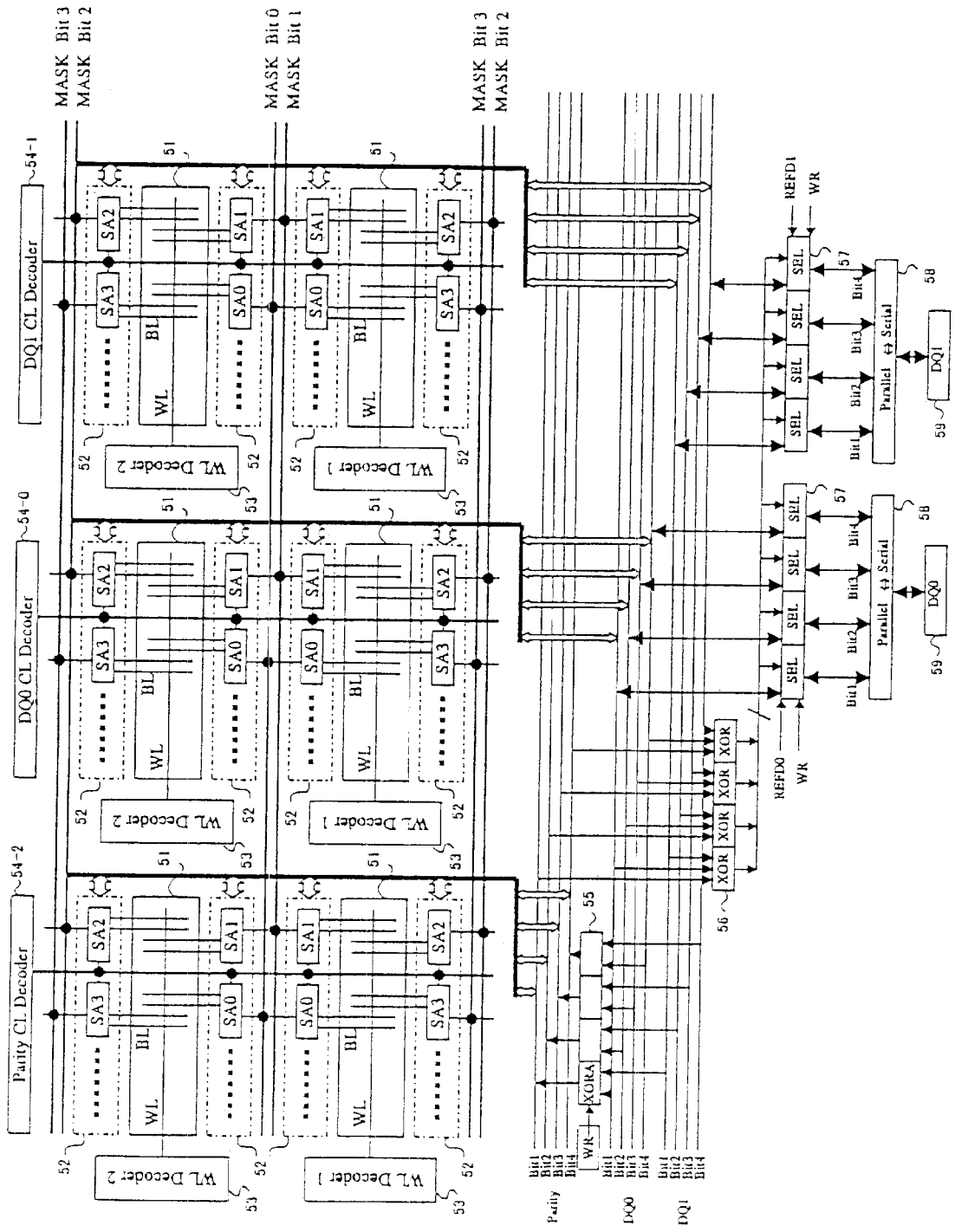
FIG. 9 is a circuit diagram showing an example of a configuration relating to a memory core and data pins according to the present invention.

FIG. 9 is a circuit diagram showing an example of the configuration relating to the memory core and data pins according to the present invention. The configuration of FIG. 9 corresponds to the case of FIG. 3 in which a mask operation is performed on a bit-specific basis. This configuration is basically the same even in the case of FIG. 6 in which a mask operation is performed on a data-pin-specific basis, except for the relation between bits and data pins are interchanged.

The circuit of FIG. 9 includes a plurality of memory blocks 51, sense amplifiers 52 corresponding to the respective memory blocks 51, word decoders 53 corresponding to the respective memory blocks 51, a column decoder 54-0 corresponding to the data pin DQ0, a column decoder 54-1 corresponding to the data pin DQ1, a column decoder 54-2 corresponding to the parity bit, a parity generation circuit (XORA) 55, an XOR circuit 56, selector circuits (SEL) 57, parallel-&-serial conversion circuits 58, and data pins 59 corresponding to DQ0 and DQ1. In comparison with the configuration of FIG. 2, the plurality of memory blocks 51 corresponds to the memory cell array 8, the word decoders 53 corresponding to the main-word-driver-&-sense-amplifier-driver circuit 18, the column decoders 54-0 through 54-2 corresponding to the column decoder 14, and the parity generation circuit 55 corresponding to the parity generation circuit 6. Further, the XOR circuit 56 and the selector circuits 57 are equivalent to the parity data comparison circuit 7. Finally, the parallel-&-serial conversion circuit 58 corresponds to the data I/O circuit 15.

The data input to the data pins 59 are converted from serial data into parallel data by the parallel-&-serial conversion circuit 58, and are supplied to the selector circuits 57. The data supplied to the selector circuits 57 are supplied to the parity generation circuit 55 and to the sense amplifiers 52 through the data bus. The parity generation circuit 55 performs an XOR operation on a bit-specific basis, and generates parity bits. For example, an XOR operation between the first data bit Bit1 of the data pin DQ0 and the first data bit Bit1 of the data pin DQ1 is performed, thereby generating a parity bit for the data bits Bit1.

The data of the data pin DQ0 are supplied to the sense amplifiers 52 connected to the column decoder 54-0. The data of the data pin DQ1 are supplied to the sense amplifiers 52 connected to the column decoder 54-1. Further, the parity bits that are generated by the parity generation circuit 55 are supplied to the sense amplifiers 52 connected to the column decoder 54-2. In conjunction with this, a selected mask signal (MASKBit0 through MASKbit3) may specify a masked bit, thereby prohibiting the specified bit from being stored in the sense amplifiers 52.

The word decoders 53 selectively activate a word line WL corresponding to the specified row address. In response, the data of the sense amplifiers 52 are stored in the memory cells of the memory blocks 51.

At the time of data read operation, the word decoders 53 selectively activate a word line WL corresponding to the specified read row address. In response, the data of memory cells are retrieved to the sense amplifiers 52. Thereafter, the column decoders 54-0 through 54-2 selectively activate a column line corresponding to the specified read column address. This results in the data of the sense amplifiers 52 being read to the data bus. When this is done, data that is retrieved from a memory block being refreshed and stored in the sense amplifiers 52 was being subjected the refresh operation, and, thus, such retrieved data may be affected by the refresh operation.

The data read in this manner are supplied to the XOR circuit 56, and are also supplied to the selector circuits 57. The XOR circuit 56 performs an XOR operation on a bit-specific basis, thereby carrying out a parity check. For example, an XOR operation is performed between the first data bit Bit1 retrieved for the data pin DQ0, the first data bit Bit1 retrieved for the data pin DQ1, and the parity bit of the first data bit Bit1, thereby checking the parity of the data bits Bit1. A parity check result of "1" indicates an error, and a parity check result of "0" indicates no error.

Based on the result of parity check, the selector circuits 57 attend to data correction on a bit-specific basis as necessary. For example, if the memory block corresponding to the data pin DQ0 is being refreshed, and if the parity check of the first data bit Bit1 indicates an error, this error is corrected by reversing the first data bit Bit1 corresponding to the data pin DQ0.

The retrieved data or retrieved and corrected data in this manner are converted from parallel data into serial data by the parallel-&-serial conversion circuits 58, followed by being output from the data pins 59.

Figure 10:
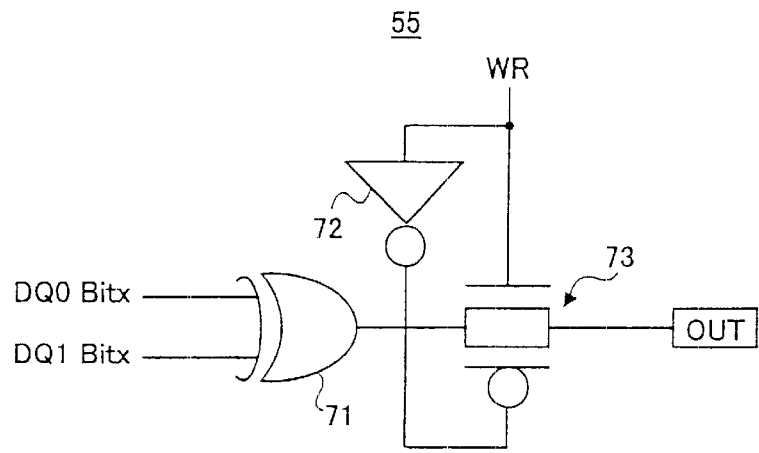
FIG. 10 is a circuit diagram showing an example of a configuration of a parity generation circuit.

FIG. 10 is a circuit diagram showing an example of the configuration of the parity generation circuit 55.

The parity generation circuit 55 includes an XOR circuit 71, an inverter 72, and a transfer gate 73 comprised of a PMOS transistor and an NMOS transistor connected in parallel. At the time of write operation, a signal WR is HIGH, so that an XOR value between the data bit Bitx (x=1, 2, 3, or 4) of the data pin DQ0 and the data bit Bitx of the data pin DQ1 is sent out as an output of the parity generation circuit 55. At the time of read operation, the signal WR is LOW, so that the transfer gate 73 is closed, thereby suspending data output from the parity generation circuit 55 so as to avoid collision with parity bits read from the memory cells.

Figure 11:
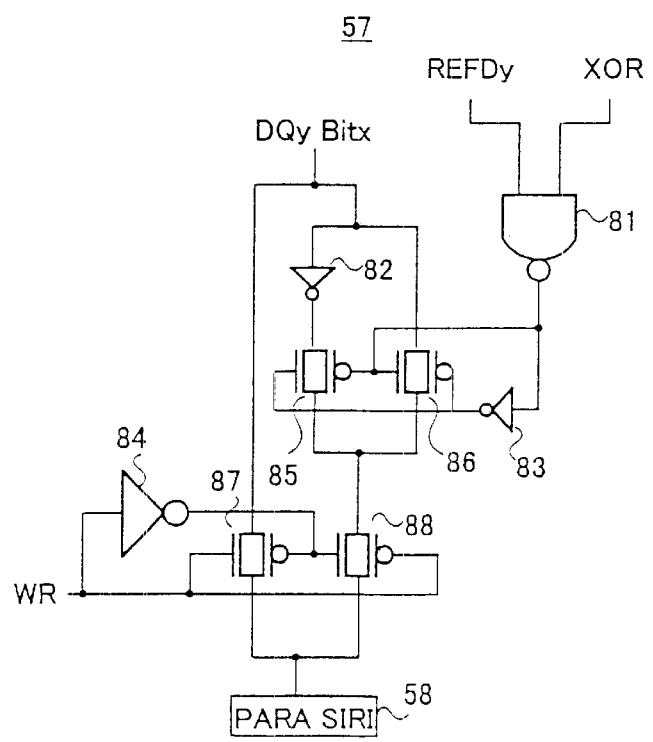
FIG. 11 is a circuit diagram showing an example of a configuration of a selector circuit.

FIG. 11 is a circuit diagram showing an example of the configuration of the selector circuit 57.

The selector circuit 57 includes a NAND circuit 81, inverters 82 through 84, and transfer gates 85 through 88 each comprised of a PMOS transistor and a NMOS transistor connected in parallel. At the time of write operation, the signal WR is HIGH, so that the transfer gate 87 is open and the transfer gate 88 is closed. AS a result, the write data supplied from the parallel-&-serial conversion circuit 58 are supplied to the data bus.

At the time of read operation, the signal WR is LOW, so that the transfer gate 87 is closed, and the transfer gate 88 is open. The signal REFDy indicates whether the data retrieved for the data pin DQy (y=0 or 1) is read from a memory block that is being refreshed. If the signal REFDy is HIGH, this indicates that the relevant data is read from a memory block being refreshed. A signal XOR is the output of the corresponding XOR circuit 56, and indicates a parity error when it is HIGH. If both the signal REFDy and the signal XOR are HIGH, the output of the NAND circuit 81 becomes LOW, thereby opening the transfer gate 85. In this case, therefore, the data Bitx (x=1, 2, 3, or 4) read for the data pin DQy is reversed before it is supplied to the parallel-&-serial conversion circuit 58. That is, if the data read from a memory block being refreshed exhibits a parity error, error correction is made through bit reversal.

Figure 12:
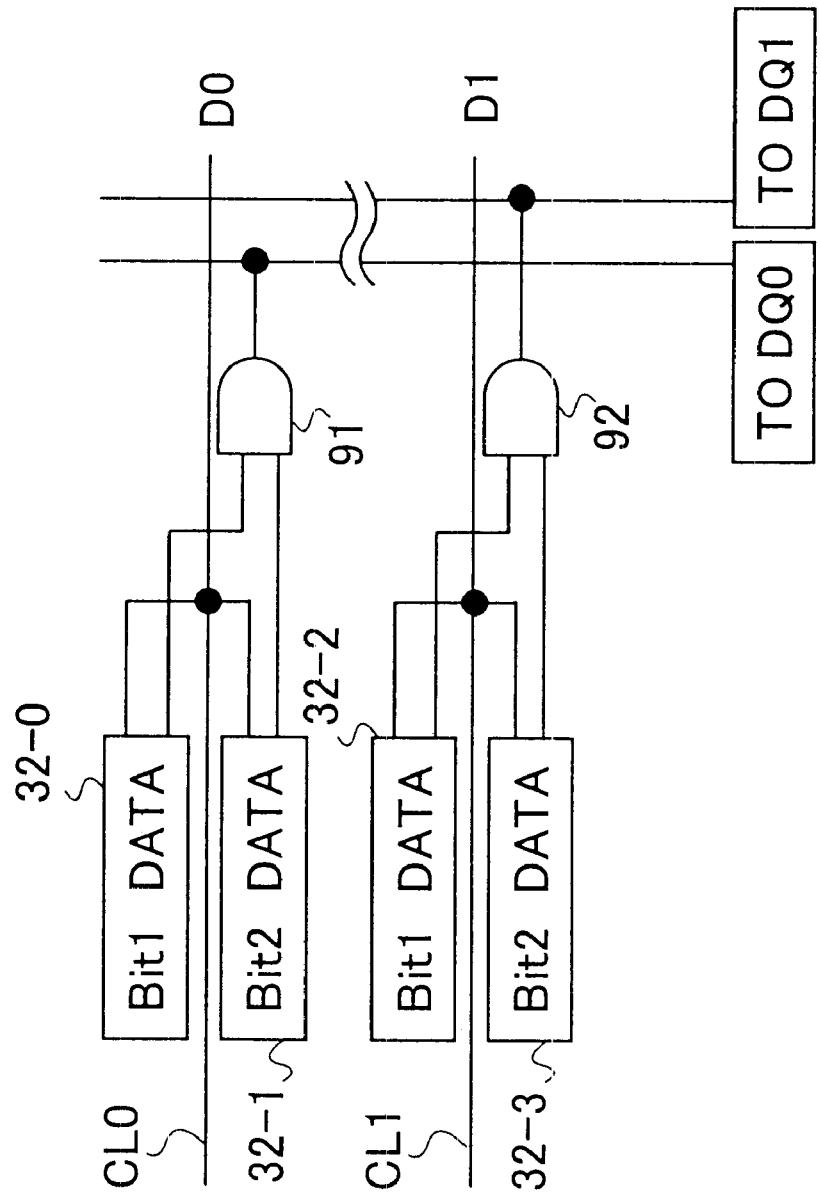
FIG. 12 is a drawing for explaining data compression at the time of a test operation of a semiconductor memory device.

FIG. 12 is a drawing for explaining data compression at the time of a test operation of a semiconductor memory device.

The test operation of a semiconductor memory device is provided with a test mode that activates a plurality of address selection lines and compresses data for the purpose of reducing a test time. In the present invention, when a plurality of data pieces arranged along the time axis are allocated to each address selection line (e.g., each of the column lines CL0 and CL1) (i.e., the configuration of FIG. 3), these data pieces can be compressed by the AND circuits 91 and 92, thereby compressing the data in a time dimension.

Figure 13A:
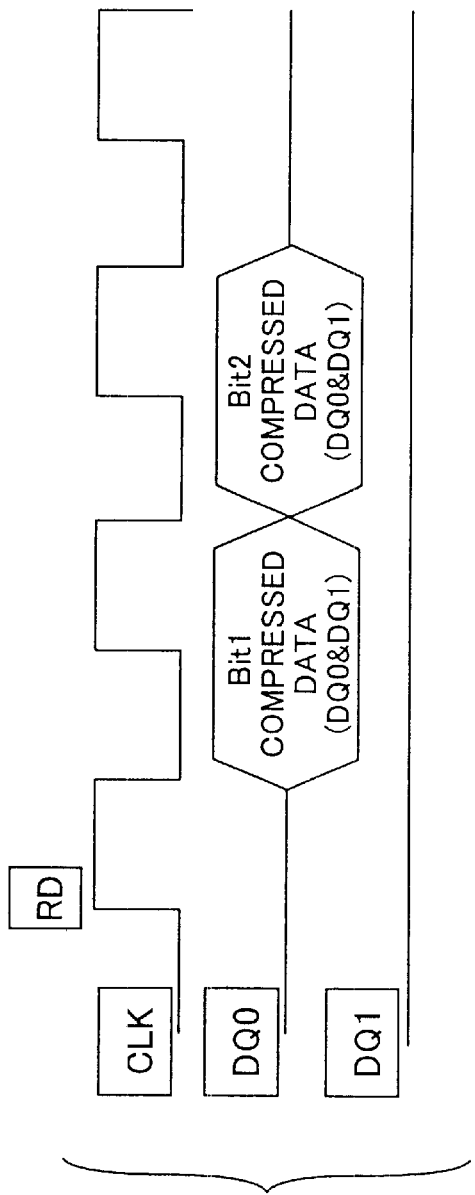
FIGS. 13A and 13B are timing charts showing the way the data compression is made.
Figure 13B:
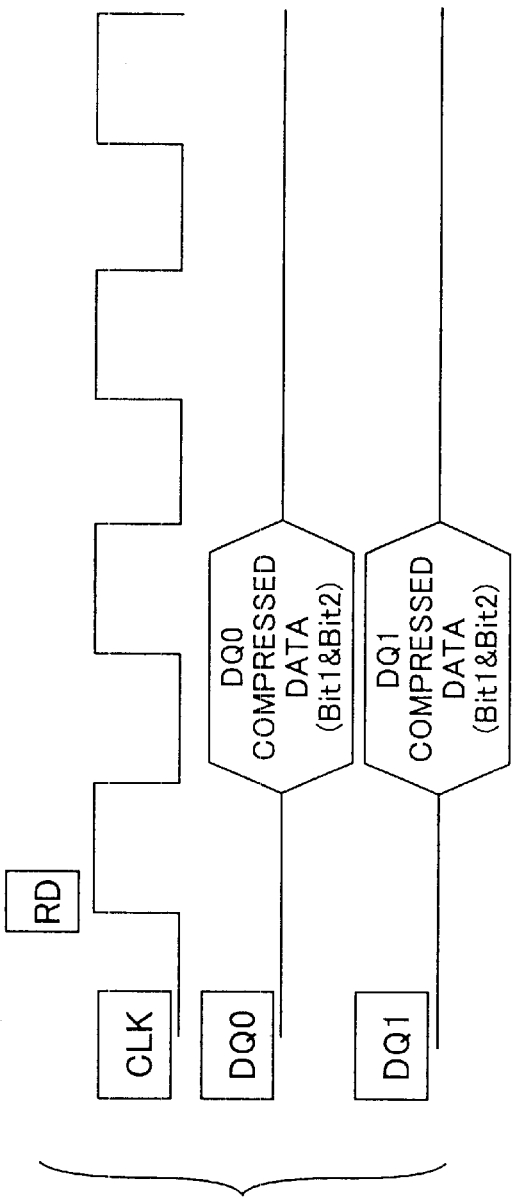

In the related-art configurations, a plurality of data pins are connected to each address selection line (e.g., each of the column lines CL0 and CL1), so that data compression will results in a reduction of the number of data pins used for the test. In this case, however, data is not compressed in a time dimension. The configuration of FIG. 3 according to the present invention can thus reduce a test time compared to the related-art configuration. FIGS. 13A and 13B show the way the data compression is made. As shown in FIG. 13A, the related-art configuration can reduce the number of data pads by compressing data during the test operation. As shown in FIG. 13B, on the other hand, the configuration of FIG. 3 according to the present invention can shorten the test time by reducing the number of operation cycles necessary for the test operation through data compression during the test operation.

Further, the present invention is not limited to these embodiments, but various variations and modifications may be made without departing from the scope of the present invention.

The present application is based on Japanese priority application No. 2001-208069 filed on Jul. 9, 2001, with the Japanese Patent Office, the entire contents of which are hereby incorporated by reference.

What is claimed is:

1. A semiconductor memory device, comprising:

a plurality of memory blocks, each of which is refreshed independently of one another;

m (m>1) data pins, each of which continuously receives or outputs n (n>1) data pieces;

a conversion circuit which converts data of each of said data pins between parallel data and serial data;

m×n data bus lines on which the n data pieces are expanded in parallel with respect to each of said m data pins;

m address selection lines which are connected to m respective blocks of said memory blocks corresponding to the m respective data pins, and are simultaneously activated, the activation of any one of said address selection lines connecting said data bus lines to a corresponding one of the m respective blocks and resulting in the n data pieces being input/output to/from the corresponding one of the m respective blocks; and a parity data comparison circuit which performs a parity check on m data pieces read from the m respective blocks corresponding to the m respective data pins and a parity bit read from a parity-purpose memory block, said parity check being performed separately with respect to each of the n data pieces.

2. The semiconductor memory device as claimed in claim 1, further comprising a mask circuit which masks a specific one of the n data pieces with respect to all said m data pins at a time of data writing.

3. The semiconductor memory device as claimed in claim 1, wherein the parity data comparison circuit reverses and thereby corrects data read from a memory block being refreshed if a parity error is detected.

4. The semiconductor memory device as claimed in claim 1, further comprising a parity generation circuit which generates the parity bit from m data pieces corresponding to said m data pins with respect to each of the n data pieces at a time of data writing.

5. The semiconductor memory device as claimed in claim 1, further comprising a circuit which compresses the n data pieces read from each of the m blocks at a time of a test operation.

6. A semiconductor memory device, comprising:

a plurality of memory blocks, each of which is refreshed independently of one another;

m (m>1) data pins, each of which continuously receives or outputs n (n>1) data pieces;

a conversion circuit which converts data of each of said data pins between parallel data and serial data;

m×n data bus lines on which the n data pieces are expanded in parallel with respect to each of said m data pins;

n address selection lines which are connected to n respective blocks of said memory blocks corresponding to the n respective data pieces, and are simultaneously activated, the activation of any one of said address selection lines connecting said data bus lines to a corresponding one of the n respective blocks and resulting in m data pieces corresponding to the m respective data pins being input/output to/from the corresponding one of the n respective blocks;

a parity data comparison circuit which performs a parity check on the n data pieces read from the n respective blocks and a parity bit read from a parity-purpose memory block, said parity check being performed separately with respect to each of the m data pieces; and a mask circuit which masks a specific one of the m data pieces with respect to all the n data pieces at a time of data writing.

7. The semiconductor memory device as claimed in claim 6, wherein the parity data comparison circuit reverses and thereby corrects data read from a memory block being refreshed if a parity error is detected.

8. The semiconductor memory device as claimed in claim 6, further comprising a parity generation circuit which generates the parity bit from the n data pieces with respect to each of the m data pieces at a time of data writing.

* * * * *